(12) United States Patent
Hwang et al.

(10) Patent No.: US 9,190,593 B2
(45) Date of Patent: Nov. 17, 2015

(54) NANO-COMPLEX THERMOELECTRIC MATERIAL, AND THERMOELECTRIC MODULE AND THERMOELECTRIC APPARATUS INCLUDING THE SAME

(71) Applicant: SAMSUNG ELECTRONICS CO., LTD., Suwon-si, Gyeonggi-do (KR)

(72) Inventors: Sung-woo Hwang, Yongin-si (KR); Kyu-hyoung Lee, Hwaseong-si (KR); Sang-il Kim, Seoul (KR); Kyung-han Ahn, Uijeongbu-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 315 days.

(21) Appl. No.: 13/660,259

(22) Filed: Oct. 25, 2012

(65) Prior Publication Data

US 2013/0269739 A1 Oct. 17, 2013

(30) Foreign Application Priority Data

Jan. 16, 2012 (KR) .................. 10-2012-0004907

(51) Int. Cl.
*H01L 35/16* (2006.01)
*H01L 35/26* (2006.01)

(52) U.S. Cl.
CPC ............... *H01L 35/16* (2013.01); *H01L 35/26* (2013.01)

(58) Field of Classification Search
CPC .................................. H01L 35/16; H01L 35/14
USPC ............ 252/62.3 T; 136/236.1, 238, 239, 240
See application file for complete search history.

(56) References Cited

U.S. PATENT DOCUMENTS

| | | | |
|---|---|---|---|
| 5,726,381 | A | 3/1998 | Horio et al. |
| 6,225,548 | B1 | 5/2001 | Sakakibara et al. |
| 6,605,772 | B2 | 8/2003 | Harman et al. |
| 2002/0092557 | A1 | 7/2002 | Ghoshal |
| 2004/0253536 | A1 | 12/2004 | Park et al. |
| 2005/0045702 | A1 | 3/2005 | Freeman et al. |
| 2006/0102224 | A1 | 5/2006 | Chen et al. |
| 2007/0028956 | A1 | 2/2007 | Venkatasubramanian et al. |
| 2009/0203196 | A1 | 8/2009 | Kim et al. |
| 2009/0205696 | A1 | 8/2009 | Koester et al. |
| 2010/0108115 | A1 | 5/2010 | Lee et al. |
| 2011/0100409 | A1 * | 5/2011 | Kim et al. ................ 136/205 |
| 2011/0139208 | A1 * | 6/2011 | Lee et al. ................ 136/236.1 |

(Continued)

FOREIGN PATENT DOCUMENTS

| | | |
|---|---|---|
| GB | 907901 A | 10/1962 |
| JP | 8-111546 A | 4/1996 |

(Continued)

OTHER PUBLICATIONS

Kim et al. "Enhancement of Seebeck Coefficient in Bi0.5Sb1.5Te3 with High-Density Tellurium Nanoinclusions," Applied Physics Express 4 (2011).

(Continued)

*Primary Examiner* — Carol M Koslow
(74) *Attorney, Agent, or Firm* — Cantor Colburn LLP

(57) ABSTRACT

A thermoelectric material including: a thermoelectric matrix; and a plurality of metal nanoparticles disposed in the thermoelectric matrix, wherein a difference between a work function of thermoelectric matrix and a work function of a metal particle of the metal nanoparticles is about −1.0 electron volt to about 1.0 electron volt.

22 Claims, 12 Drawing Sheets

(56) References Cited

U.S. PATENT DOCUMENTS

| | | | |
|---|---|---|---|
| 2012/0090656 A1 | 4/2012 | Snyder et al. | |
| 2012/0186621 A1* | 7/2012 | Kim et al. | 136/200 |

FOREIGN PATENT DOCUMENTS

| | | |
|---|---|---|
| JP | 2000164940 | 6/2000 |
| JP | 2002-026405 A | 1/2002 |
| JP | 2003-133597 A | 5/2003 |
| JP | 2009194085 A | 8/2009 |
| JP | 2011-516370 A | 5/2011 |
| JP | 2011-134989 A | 7/2011 |
| KR | 1020070108853 A | 11/2007 |
| WO | 08140596 | 3/2007 |
| WO | 2009/098248 A2 | 8/2009 |
| WO | 2010041146 A2 | 4/2010 |
| WO | 2010080279 A2 | 7/2010 |

OTHER PUBLICATIONS

L.D. Hicks et al., "Use of quantum-well superlattices to obtain a high figure of merit from nonconventional thermoelectric materials", Appl. Phys. Lett. vol. 63, No. 23, Dec. 6, 1993, pp. 3230-3232.

Sang Il Kim et al., "Enhancement of Seebeck Coefficient in Bi0.5Sb1.5Te3 with High-Density Tellurium Nanoinclusions", Applied Physics Express 4 (Sep. 7, 2011), pp. 091801-1-091801-3.

Sergey V. Faleev et al., "Theory of enhancement of thermoelectric properties of materials with nanoinclusions", Physical Review, B 77, 2008, pp. 214304-1-214304-9.

Slack, "New Materials and Performance Limits for Thermoelectric Cooling", Thermoelectric Materials, 1995, pp. 409-421.

T. Caillat et al, "Thermoelectric Properties of $(Bi_x Sb_{1-x})_2 Te_3$ Single Crystal Solid Solutions Grown by the T.H.M. Method", J. Phys. Chem. Solids, vol. 53, No. 8, 1992, pp. 1121-1129.

Mahan et al., "Multilayer Thermionic Refrigeration", Physical Review Letters, vol. 80, No. 18, May 4, 1998, pp. 4016-4019.

* cited by examiner

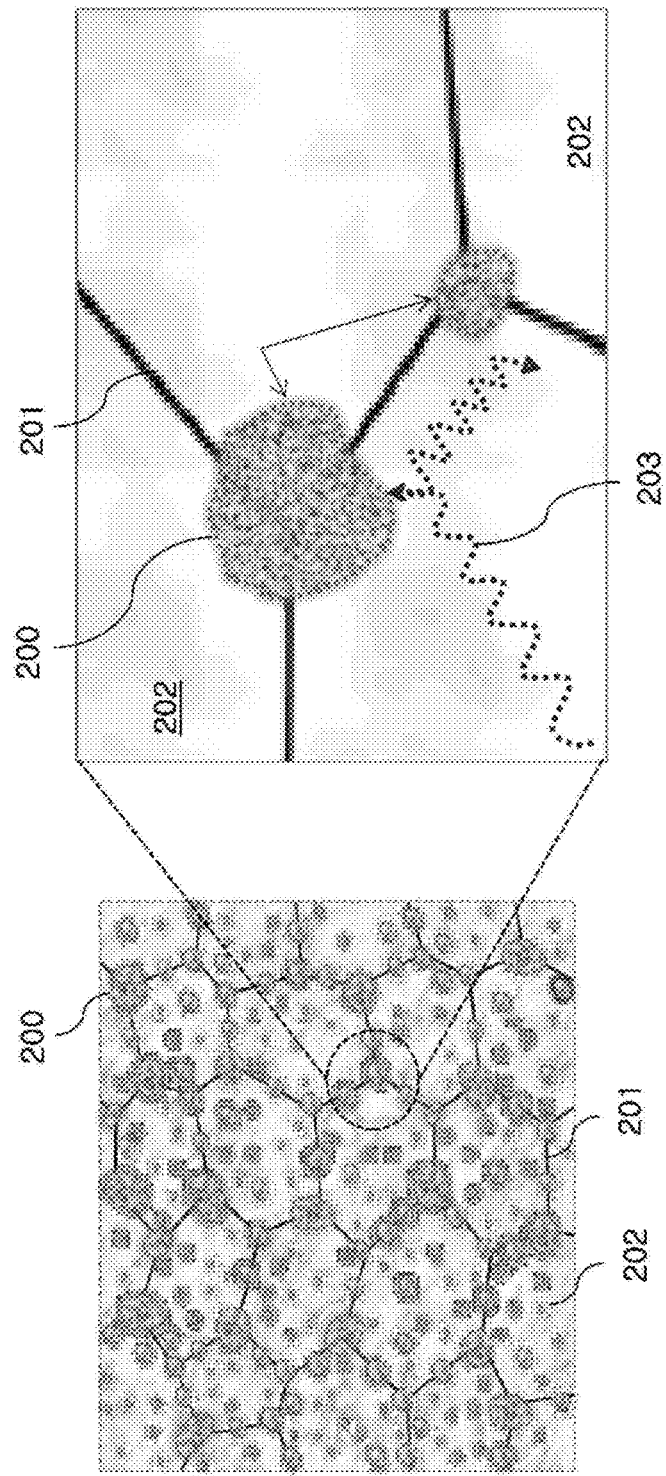

NANO-COMPLEX THERMOELECTRIC MATERIAL, AND THERMOELECTRIC MODULE AND THERMOELECTRIC APPARATUS INCLUDING THE SAME

This application claims priority to and the benefit of Korean Patent Application No. 10-2012-0004907, filed on Jan. 16, 2012, and all the benefits accruing therefrom under 35 U.S.C. §119, the content of which is incorporated herein in its entirety by reference.

BACKGROUND

1. Field

The present disclosure relates to a nano-complex thermoelectric material, and a thermoelectric module and a thermoelectric apparatus including the nano-complex thermoelectric material, and more particularly, to a nano-complex thermoelectric material, and a thermoelectric module and a thermoelectric apparatus including the nano-complex thermoelectric material having a high Seebeck coefficient, high electrical conductivity, and low thermal conductivity.

2. Description of the Related Art

The thermoelectric effect is a reversible, direct energy conversion from heat to electricity and vice versa, which occurs when electrons and holes move in a material. Examples of the thermoelectric effect include the Peltier effect, which is used in cooling systems operating based on a temperature difference between ends of a material caused when an electrical current is applied thereto, and the Seebeck effect, which is used in power-generation systems operating based on an electromotive force generated due to a temperature difference between ends of a material.

Currently, thermoelectric materials are used in active cooling systems of semiconductor equipment and electronic devices for which use of a passive cooling system is inefficient. In addition, demands for thermoelectric materials in areas such as precise temperature control systems in DNA applications where conventional refrigerant gas compression systems are ineffective have increased. Thermoelectric cooling is an environmentally friendly cooling technique that does not use a refrigerant gas, which can cause environmental problems, and does not generate vibration or noise. If highly efficient thermoelectric cooling materials are developed, they could be used in general cooling systems such as refrigerators or air conditioners. In addition, thermoelectric materials are regarded as a renewable energy source because thermoelectric materials can be used to capture energy that would have otherwise been lost from heat dissipation, for example from a vehicle engine or an industrial plant.

Thus there remains a need for an improved thermoelectric material.

SUMMARY

Provided is a nano-complex thermoelectric material having a high Seebeck coefficient and electrical conductivity and a low thermal conductivity.

Provided is a thermoelectric module including the nano-complex thermoelectric material.

Provided is a thermoelectric apparatus including the nano-complex thermoelectric material.

Additional aspects will be set forth in part in the description which follows and, in part, will be apparent from the description.

According to an aspect, a thermoelectric material includes a thermoelectric matrix; and a plurality of metal nanoparticles disposed in the thermoelectric matrix, wherein a difference between a work function of the thermoelectric matrix and a work function of a metal nanoparticle of the metal nanoparticles is about −1.0 electron volt to about 1.0 electron volt.

The thermoelectric matrix may be represented by Formula 1:

$$A_xM_y,$$ Formula 1 wherein A is one or more selected from Bi, Sb, Co, Pb, Mg, and Si, M is one or more selected from Te, Se, Sb, Si, and Ge, $0<x\leq4$, and $0<y\leq4$.

A work function of the metal nanoparticles may be about 3.5 electron volts to about 5.5 electron volts.

The metal nanoparticles may include one or more selected from Si, Zn, Pd, Co, Ni, Tb, Mo, Gd, Mn, and Fe.

According to another aspect, disclosed is a thermoelectric element including the thermoelectric material.

According to another aspect, a thermoelectric module includes a first electrode; a second electrode; and the thermoelectric element disposed between the first and second electrodes.

According to another aspect, a thermoelectric apparatus may include a heat supply source; and the thermoelectric module, which is effective to absorb heat from the heat supply source.

According to another aspect disclosed is a manufacturing method of the nano-complex thermoelectric material. The manufacturing method includes providing a precursor of metal nanoparticles in an organic solvent; adding a thermoelectric matrix powder to the precursor of metal nanoparticles in an organic solvent to form a mixture; and drying and heat treating the mixture to manufacture the thermoelectric material.

The precursor of the metal nanoparticles may include one or more selected from an acetate, an acetylacetonate, or an alkoxide of a metal.

The method may further include bulking the thermoelectric material by press sintering after the drying and the heat treating.

BRIEF DESCRIPTION OF THE DRAWINGS

These and/or other aspects will become apparent and more readily appreciated from the following description of the embodiments, taken in conjunction with the accompanying drawings in which:

FIG. 2A is a diagram illustrating a nano-structure of an embodiment of the nano-complex thermoelectric material;

FIG. 2B is an enlarged view of the circled region of FIG. 2A;

DETAILED DESCRIPTION

Figure 1A:
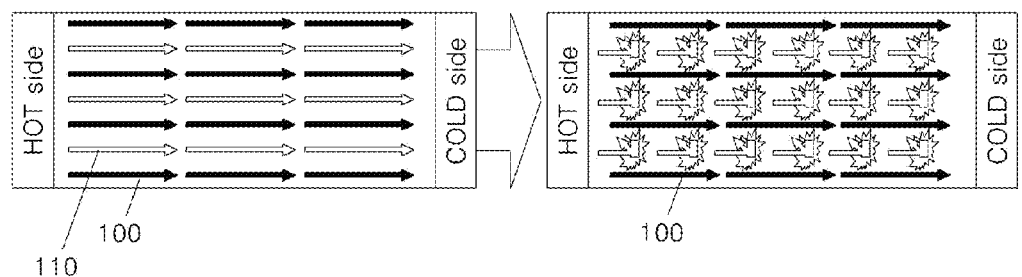
FIG. 1A is a conceptual diagram illustrating an embodiment of a phonon glass electron crystal (PGEC) concept of the nano-complex thermoelectric material.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "one or more" when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "one or more" unless the content clearly indicates otherwise. "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The performance of a thermoelectric material is evaluated using a dimensionless figure of merit ZT defined by Equation 1.

$$ZT = \frac{S^2 \sigma T}{k} \qquad \text{Equation 1}$$

In Equation 1, S is a Seebeck coefficient, σ is electrical conductivity, T is absolute temperature, and K is thermal conductivity.

An increase of ZT of a thermoelectric material may be obtained by increasing the Seebeck coefficient and the electrical conductivity, that is, the power factor ($S^2\sigma$), and/or by decreasing the thermal conductivity.

However, if one of the Seebeck coefficient and the electrical conductivity is increased due to a change in carrier (e.g., electron or hole) concentration, the other element is reduced. That is, the Seebeck coefficient and the electrical conductivity have a trade-off relationship, which is a major obstacle in improving the power factor.

As nanostructuring technology has rapidly developed from the late 1990s, it is possible to prepare a superlattice thin film, a nanowire, or a quantum dot. Thus, the Seebeck coefficient can be increased according to a quantum confinement effect or thermal conductivity can be decreased according to a phonon glass electron crystal (PGEC) concept, and thus it is possible to provide improved thermoelectric performance using nanotechnology and a PGEC concept.

In the quantum confinement effect, an effective mass increases by increasing a density of states (DOS) of a carrier in a material to increase the Seebeck coefficient without a significant change in electrical conductivity (thus collapsing the trade-off relationship between electrical conductivity and the Seebeck coefficient). In the PGEC concept, only thermal conductivity is reduced without deteriorating the electrical conductivity by blocking a movement of a phonon in charge of heat transfer and not interfering with a movement of a charge carrier. However, most of the high efficiency nano-structured thermoelectric materials which have been developed until now have a thin film shape, and thus, commercialization thereof is difficult due to limitations of a bulk technology that is desirable for commercial application.

According to an embodiment, a nano-complex thermoelectric material includes a thermoelectric matrix; and a plurality of metal nanoparticles disposed (e.g., dispersed) in the thermoelectric matrix. A difference between the work function of the thermoelectric matrix and the work function of a metal nanoparticle of the metal nanoparticles is about ±1.0 electron volt (eV) or less, specifically about −0.9 eV to about 0.9 eV, more specifically about −0.8 eV to about 0.8 eV. In an embodiment, the difference between the work function of the thermoelectric matrix and an average work function of the metal nanoparticles is about ±1.0 electron volt (eV) or less, specifically about −0.9 eV to about 0.9 eV, more specifically about −0.8 eV to about 0.8 eV.

While not wanting to be bound by theory, it is understood that the nano-complex thermoelectric material may have an increased Seebeck coefficient because the metal nanoparticles disposed in the thermoelectric matrix cause a change to the state of electrons at an interface of the thermoelectric matrix, (e.g., on the surface of grain boundaries or at an interface of grain boundaries of the thermoelectric matrix and a metal nanoparticle), thereby contributing to a carrier filtering effect. That is, it is understood that the metal nanoparticles work as phonon scattering centers which allow electrons to pass through and scatter phonons at the interface of the thermoelectric matrix. This is referred to as the phonon glass electron crystal effect (PGEC). As a result, lattice thermal conductivity decreases. Therefore, a ZT value, which is a performance index of a thermoelectric material, may increase.

The metal nanoparticles may be disposed in the thermoelectric matrix uniformly, non-uniformly, randomly, or non-randomly. In an embodiment, the metal nanoparticles are disposed to have a concentration gradient. In an embodiment, the concentration gradient may increase towards a center of the nano-complex thermoelectric material, and in another embodiment the concentration gradient may decrease towards a center of the nano-complex thermoelectric material. In another embodiment, the concentration gradient may vary in a direction from a first end of the nano-complex thermoelectric material to an opposite second end of the nano-complex thermoelectric material.

Figure 1B:
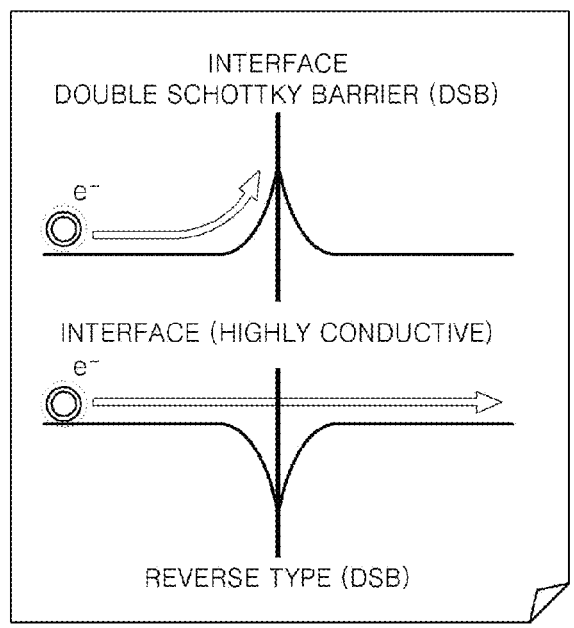
FIG. 1B is a conceptual diagram illustrating improvement of electrical conductivity of an embodiment of the nano-complex thermoelectric material.

FIG. 1A is a conceptual diagram illustrating a PGEC concept of an embodiment of the nano-complex thermoelectric material. FIG. 1B is a conceptual diagram illustrating an effect that improves electrical conductivity of the nano-complex thermoelectric material according to an embodiment. As shown in FIG. 1A, and while not wanting to be bound by theory, it is understood that the metal nanoparticles present on a surface of the thermoelectric matrix, i.e., at an interface at a grain boundary of the thermoelectric matrix or at a boundary between particles of the thermoelectric matrix, may decrease a lattice thermal conductivity by letting electrons 100 pass through and scattering phonons 110, and thus, a ZT value may be increased. Also, as shown in FIG. 1B, highly electrically conductive metal nanoparticles present at the interface of the thermoelectric matrix may improve the electrical conductivity of the nano-complex thermoelectric material.

Particularly, if a difference between the work function thermoelectric matrix and the work function of the metal nanoparticles is about ±1.0 eV or less, for example, about ±0.41 eV or less, a power factor is significantly increased and a lattice thermal conductivity is significantly decreased. Consequently, the thermoelectric performance is unexpectedly improved. An embodiment in which the difference between the work function thermoelectric matrix and the average work function of the metal nanoparticles is about ±0.41 eV is specifically mentioned.

FIGS. 2A and B are diagrams illustrating a nano-structure of an embodiment of the nano-complex thermoelectric material. As shown in FIGS. 2A and 2B (which is an enlarged view of a portion of FIG. 2A), the metal nanoparticles 200 are present on the interface 201 of the thermoelectric matrix 202. As a result, and while not wanting to be bound by theory, an electrical conductivity of the nano-complex thermoelectric material is improved due to the high electrical conductivity of the metal nanoparticles. Also, the thermal conductivity is reduced due to the phonons being scattered 203 by the metal nanoparticles, and thus, the Seebeck coefficient of the nano-complex thermoelectric material may be increased.

In the nano-complex thermoelectric material according to an embodiment, the metal nanoparticles dispersed in the thermoelectric matrix may be chemically and/or physically bound to a surface of the thermoelectric matrix, including a grain boundary of the thermoelectric matrix and/or between particles of the thermoelectric matrix. An example of a chemical bond may be an ionic bond or a metallic bond, and an example of a physical bond may be adsorption or a Van der Waals bond. The thermoelectric matrix and the metal nanoparticles may form a complex, a composite, or a combination thereof. A complex is specifically mentioned.

For the thermoelectric matrix used in the nano-complex thermoelectric material, any thermoelectric material that is used in the art may be used so long as the thermoelectric material provides suitable properties. The thermoelectric material may be represented by Formula 1.

$$A_x M_y \qquad \text{Formula 1}$$

In Formula 1, A is one or more selected from Bi, Sb, Co, Pb, Mg, and Si; M is one or more selected from Te, Se, Sb, Si, and Ge; $0<x\leq4$; and $0<y\leq4$. In an embodiment, A is one or more selected from Bi, Sb, Co, and Si; and M is one or more selected from Te, Se, and Ge. In an embodiment, $0.1<x\leq3.8$, and $0.1<y\leq3.8$. In another embodiment, $0.2<x\leq3.6$, and $0.2<y\leq3.6$.

For example, the thermoelectric matrix may be a Bi—Te alloy which may be represented by Formula 2.

$$A'_2 M'_3 \qquad \text{Formula 2}$$

In Formula 2, A' is one or more selected from Bi and Sb, and M' is one or more selected from Te and Se.

An example of the Bi—Te alloy is p-type $(Bi_a Sb_{1-a})_2 Te_3$, or n-type $Bi_2(Te_b Se_{1-b})_3$ (wherein $0\leq a<1$ and $0\leq b<1$).

A work function of the metal nanoparticles may be within a range from about 3.5 eV to about 5.5 eV, specifically about 3.6 eV to about 5.4 eV, more specifically about 3.7 eV to about 5.3 eV. If the work function of the metal nanoparticles is within the range above, a power factor may be increased and lattice thermal conductivity may be decreased.

The metal nanoparticles may comprise one or more selected from Si, Zn, Pd, Co, Ni, Tb, Mo, Gd, Mn, and Fe, specifically one or more selected from Si, Zn, Co, Ni, Tb, Mo, Gd, Mn, and Fe.

The metal nanoparticles may have an average diameter of about 5 nanometers (nm) to about 50 nm, specifically about 10 nm to about 40 nm, more specifically about 15 nm to about 30 nm. If the average diameter of the metal nanoparticles is within the range above, the metal nanoparticles may effectively scatter phonons.

The thermoelectric matrix and the metal nanoparticles may be contained in a selected content ratio. For example, the metal nanoparticles may be included in an amount of about 0.001 part to about 2.0 parts by weight, specifically about 0.01 part to about 1.5 parts by weight, more specifically about 0.05 part to about 1.0 part by weight, per 100 parts by weight of the thermoelectric matrix of the nano-complex thermoelectric material. In an embodiment, an amount of the metal nanoparticles is about 0.1 part to about 0.2 part by weight, based on a total weight of the thermoelectric matrix. If the amount of the metal nanoparticles is within the range above, effective phonon scattering may be induced.

An example of the nano-complex thermoelectric material may be $(Bi,Sb)_x Te_y/M''_z$ or $Bi_x(Te,Se)_y/M''_z$, wherein M'' is one or more of Si, Zn, Pd, Co, Ni, Tb, Mo, Gd, Mn, and Fe, $0<x\leq 4$, $0<y\leq 4$, $0<z\leq 3$, and "/" indicates that the thermoelectric matrix and the metal nanoparticles form a complex. A particular example may be $Bi_x Sb_{2-x} Te_3$ wherein $0.4 \leq x \leq 0.5$ combined (e.g., complexed) with 0.2 wt % of Mn, $Bi_{0.5}Sb_{1.5}Te_3$ combined (e.g., complexed) with 0.2 wt % of Si, or $Bi_{0.4}Sb_{1.6}Te_3$ complexed with (e.g., incorporated with) 0.2 wt % Si, or the like.

Hereinafter, a method of manufacturing the nano-complex thermoelectric material will be further disclosed.

The method of manufacturing the nano-complex thermoelectric material may include providing a precursor solution comprising the metal nanoparticles. The precursor solution of the metal nanoparticles may be provided by dissolving a precursor of the metal nanoparticles in an organic solvent; contacting (e.g., adding and/or mixing) a thermoelectric matrix with the precursor the solution to form a mixture; and drying and heat-treating the mixture to manufacture the thermoelectric material. The thermoelectric matrix may be in the form of a powder.

The thermoelectric matrix may be manufactured using a commercially available thermoelectric material or a thermoelectric material having any suitable composition prepared using any of the following methods:

A method using an ampoule: the method includes disposing a raw material in a quartz tube or metal ampoule at a predetermined amount, sealing and heat-treating the quartz tube or metal ampoule in vacuum.

An arc melting method: the method includes disposing a raw material in a chamber in a selected amount and preparing a sample by melting the raw material by arc discharging in an inert gas atmosphere.

A solid state reaction method: the method includes mixing a raw powder at a predetermined amount, hardening the mixed powder, and heat-treating thereafter or heat-treating the mixed powder, processing, and sintering thereafter.

A metal flux method: the method includes adding a raw material in a selected amount and an element that provides an environment suitable for the raw material to grow a crystal at a high temperature in a crucible, and heat-treating the element at a high temperature to grow a crystal.

A Bridgeman's method: the method includes adding a raw material in a selected amount to a crucible, heating an end portion of the furnace until the raw material is melted, and locally melting the sample by slowly moving a high-temperature region so as to the entire sample may pass through the high-temperature region to grow crystals.

An optical floating zone method: the method includes preparing a raw material at a predetermined amount in the form of a seed rod and a feed rod, focusing a lamp on the feed rod to locally melt the sample at a high temperature, and slowly moving the melted portion upward to grow a crystal.

A vapor transport method: the method includes adding a raw material to a bottom of a quartz tube and heating the bottom of the quartz tube where the raw material is while a top of the quartz tube is left open to stay at a lower temperature so that a crystal is grown as the raw material is vaporized.

A mechanical alloying method: the method includes forming an alloy-type thermoelectric material by adding and rotating a raw material powder and a ball (e.g., a steel ball) in a container (e.g., a container comprising a cemented carbide) which enables the ball to mechanically impact the raw material powder.

A manufacturing method of a nano-complex thermoelectric material according to an embodiment may implement a carrier filtering effect, increasing the Seebeck coefficient, and the PGEC concept, decreasing the lattice thermal conductivity in a bulk material by uniformly disposing (e.g., dispersing) metal nanoparticles on an interface or on a surface of a thermoelectric matrix, wherein the interface can be a grain boundary of the thermoelectric matrix or a boundary between particles of the thermoelectric matrix.

The manufacturing method of a nano-complex thermoelectric material according to an embodiment may be referred to as a nano-metal decoration method. Compared to another method, the manufacturing method of a nano-complex thermoelectric material may improve dispersion of the metal nanoparticles in a thermoelectric matrix, such as a Bi—Te alloy, by using a wet blending method through an ultrasound treatment or the like in a selected organic solvent. Ultimately, a power factor may be rapidly increased by increasing the electrical conductivity and Seebeck coefficient of a thermoelectric material as the metal nanoparticles with high electrical conductivity are disposed, e.g., uniformly dispersed, in the thermoelectric matrix, and thus, a ZT value, which is a performance index of a thermoelectric material, may increase.

A precursor of the metal nanoparticle used for the manufacturing method of a nano-complex thermoelectric material according to an embodiment may comprise one or more selected from an acetate, an acetylacetonate, and an alkoxide of a metal. For example, the precursor may comprise one or more selected from an acetate, acetylacetonate, and an alkoxide of one or more metals selected from Si, Zn, Pd, Co, Ni, Tb, Mo, Gd, Mn, and Fe. Particularly, the precursor may be one or more selected from cobalt acetate tetrahydrate, zinc acetate, palladium(II) acetate, gadolinium(III) acetate $xH_2O$, terbium (III) acetate hydrate, vanadium(III) acetylacetonate, manganese(II) acetate, molybdenum acetate (e.g., molybdenum acetate dimer), iron(II) acetate, nickel acetate tetrahydrate, and tetraethoxysilane.

The precursor of the metal nanoparticles may be decomposed under a reducing atmosphere at a temperature of about 300° C. or less, specifically about 300° C. to about 100° C., and thus, may be favorably used in manufacturing the nano-complex thermoelectric material.

A wet blending method such as a method comprising an ultrasound treatment in an organic solvent may be used to manufacture a nano-complex thermoelectric material including metal nanoparticles that are uniformly dispersed in a thermoelectric matrix, such as a Bi—Te alloy, with the precursors of the metal nanoparticles, which may be one or more selected from as an acetate, an acetylacetonate, and an alkoxide of a metal as a starting material.

For example, if the precursor of the metal nanoparticles is added to an organic solvent to form a colloid or a solution, and a thermoelectric matrix, e.g., a thermoelectric matrix in the form of a powder, such as a Bi—Ti alloy, is added to the colloid (or the solution), mixed, and dried, the precursor of the metal nanoparticles may be uniformly dispersed and attached on a surface of the thermoelectric matrix. Then, if an organic group, such as an acetate group, is disassociated by heat treatment, for example, heat treatment under a reducing atmosphere with a continuous flow of nitrogen/hydrogen mixed gas may provide a nano-complex thermoelectric material powder in which the metal nanoparticles are disposed on a surface of the thermoelectric matrix, specifically at an interface between grains and/or particles of the thermoelectric matrix. In an embodiment the heat treatment may be performed at a temperature of about 200° C. to about 450° C., specifically about 300° C. to about 400° C.

The metal nanoparticles, which may be attached to a surface of the thermoelectric matrix, may have an average diameter of about 1 nm to about 50 nm, specifically about 2 nm to about 40 nm, more specifically about 3 nm to about 30 nm.

The manufacturing method of a nano-complex thermoelectric material according to an embodiment may further include bulking the nano-complex thermoelectric material powder, which is obtained after the drying and heat treating, by press sintering.

The bulking may be performed by hot pressing or spark plasma sintering under pressure.

An interfacial reaction between the metal nanoparticles and the nano-complex thermoelectric material may be initiated by the press sintering and, if desired, an annealing process may be included. If the state before the reaction completes is maintained, a density may increase as a nano-complex phase formed after the reaction and unreacted metal nanoparticles coexist. Also, and while not wanting to be bound by theory, a newly formed interface may work as a scattering center causing scattering of phonons (understood to be mainly mid/long-wavelength phonons) together with the surface of the metal nanoparticles, and thus, the lattice thermal conductivity may be expected to be further decreased.

The precursor of the metal nanoparticles in the manufacturing method of a nano-complex thermoelectric material according to an embodiment may be used in an amount of about 0.001 part to about 2.0 parts by weight, specifically about 0.05 part to about 1.0 part by weight, for example about 0.1 part to about 0.2 part by weight of the metal nanoparticles, based on 100 parts by weight of the thermoelectric matrix in the resulting nano-complex thermoelectric material.

In the press sintering process of the nano-complex thermoelectric material powder, the pressure may be about 30 mega-Pascals (MPa) to about 1000 MPa, specifically about 50 MPa to about 100 MPa. The temperature may be about 300° C. to about 550° C., specifically about 350° C. to about 480° C. The sintering time may be, for example, about 1 minute to about 1 hour, specifically about 5 minutes to about 10 minutes.

According to another embodiment, a thermoelectric element obtained by shaping the nano-complex thermoelectric material with a method such as a cutting process, or the like, is provided. If the nano-complex thermoelectric material has a single-crystal structure, a cutting direction of the nano-complex thermoelectric material may be independently selected and may be, for example, perpendicular to a growing direction of the thermoelectric material, or parallel to a growth direction of the thermoelectric material.

The thermoelectric element may be a p-type thermoelectric element or an n-type thermoelectric element. Also, the thermoelectric element may have any suitable shape, for example, a rectangular parallelepiped shape. The shape of the thermoelectric element may be any suitable shape, and may be rectilinear, e.g., rectangular.

If a concentration gradient of the metal nanoparticles is present, the gradient may extend from a first end of the thermoelectric element to an opposite second end of the thermoelectric element. In an embodiment, the concentration of the metal nanoparticles increases in a direction from the first end to the second end of the thermoelectric element.

The thermoelectric element may be connected to an electrode and thus may have a cooling effect due to current induction. Also, the thermoelectric element may have a composition which may have an electricity generating effect due to a temperature difference.

Figure 3:
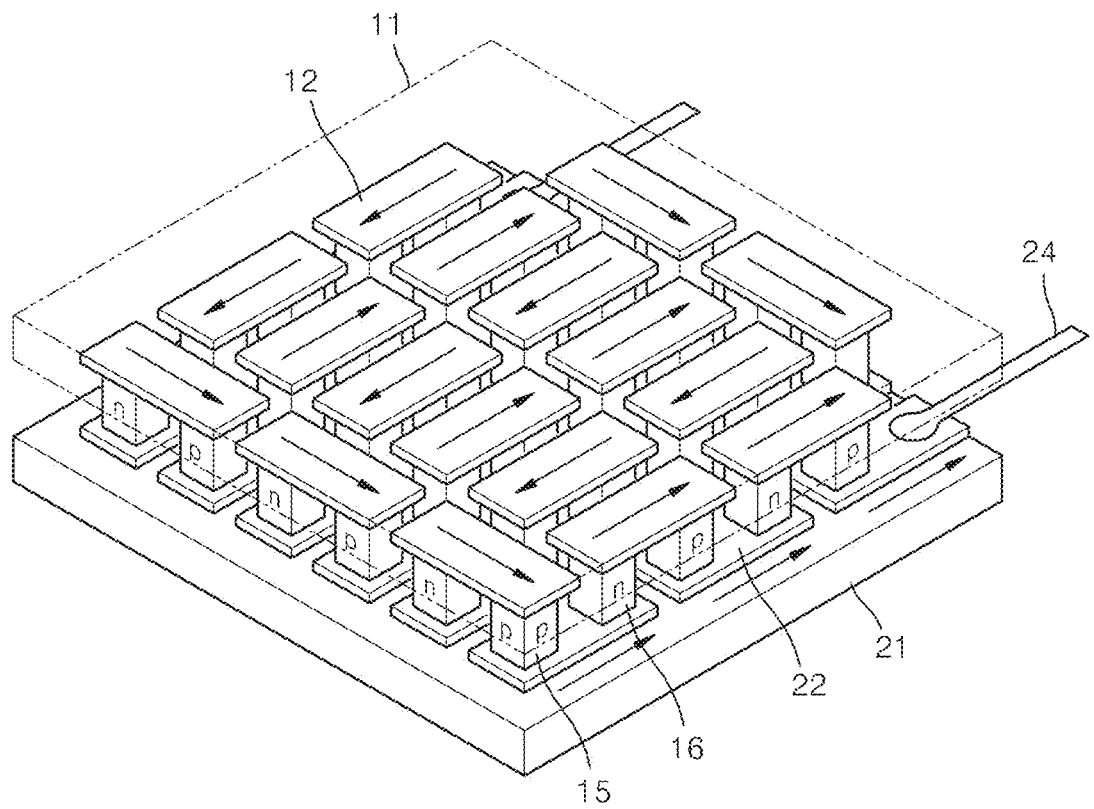
FIG. 3 is a diagram of an embodiment of a thermoelectric module comprising the thermoelectric element.

FIG. 3 is a diagram of an embodiment of a thermoelectric module comprising an embodiment of the thermoelectric element. As shown in FIG. 3, an upper electrode 12 and a lower electrode 22 are patterned respectively on an upper insulating substrate 11 and a lower insulating substrate 21, and a p-type thermoelectric element 15 and an n-type thermoelectric element 16 mutually contact the upper electrode 12 and the lower electrode 22. The upper and lower electrodes 22 and 12 are electrically connected to the outside of the thermoelectric element via a lead electrode 24.

The upper and lower insulating substrates 11 and 21 may comprise one or more selected from a gallium arsenic (GaAs), sapphire, silicon, PYREX, and quartz. Also, the upper and lower electrodes 12 and 22 may comprise one or more selected from aluminum, nickel, gold, and titanium, and may have any suitable size. The upper and lower electrodes 12 and 22 may be patterned by using any suitable patterning method, such as a lift-off semiconductor process, a deposition method, or a photolithography method.

Figure 4:
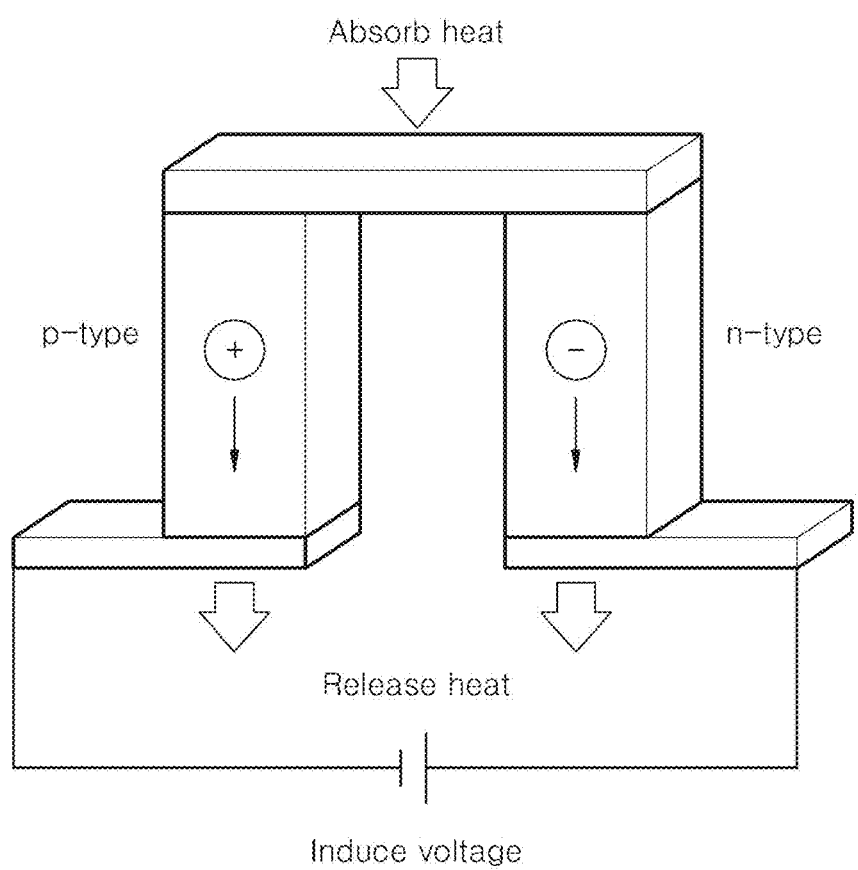
FIG. 4 is a diagram of an embodiment of a thermoelectric module comprising the thermoelectric element.
Figure 5:
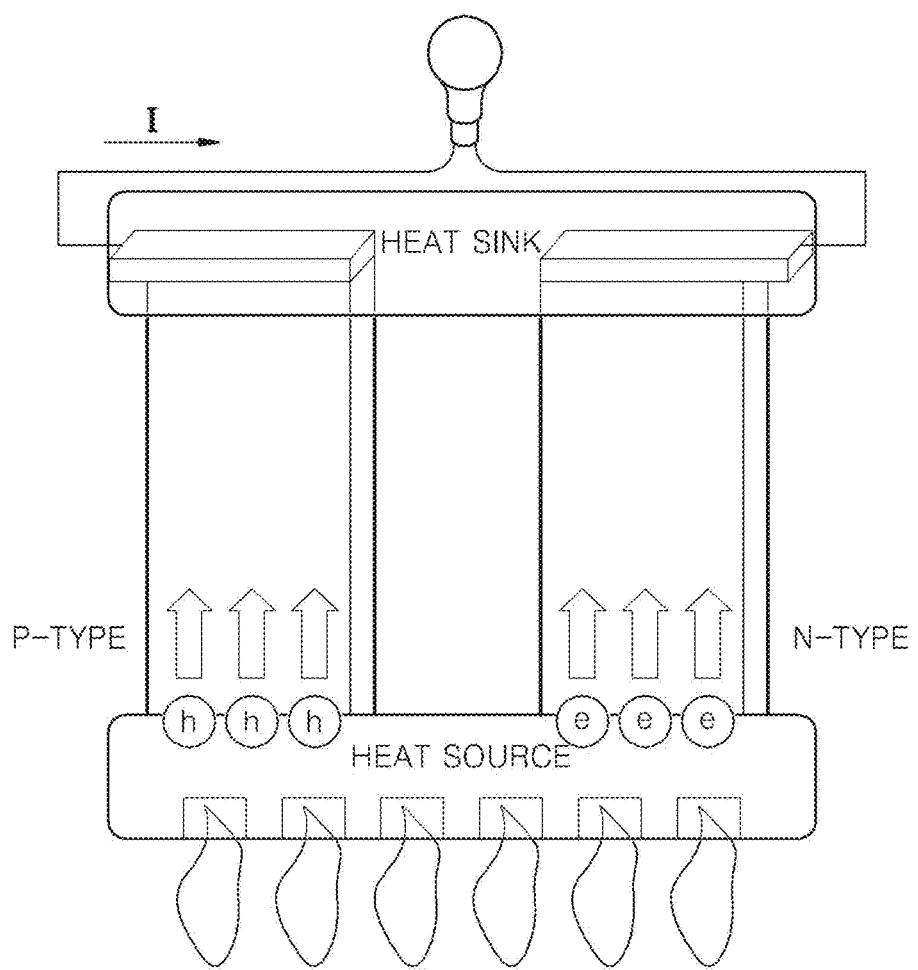
FIG. 5 is a diagram of an embodiment of a thermoelectric module comprising the thermoelectric element.

Alternatively, a thermoelectric module may include a first electrode, a second electrode, and the nano-complex thermoelectric material disposed between the first and second electrodes, as shown in FIGS. 4 and 5. The thermoelectric modules of FIGS. 4 and 5 may further include an insulating substrate to which at least one of the first and second electrodes is disposed. The insulating substrate may be one of the upper and lower insulating substrates 11 and 21 shown in FIG. 3.

In a thermoelectric module according to an embodiment, one of the first and second electrodes may be exposed to a heat supply source, as shown in FIGS. 4 and 5. In a thermoelectric module according to an embodiment, one of the first and second electrodes may be electrically connected to a power supply source or may be electrically connected to an exterior of the thermoelectric module, for example an electric element (e.g., a battery), which consumes or stores electricity.

In a thermoelectric module according to an embodiment, as shown in FIG. 3, a p-type thermoelectric element and an n-type thermoelectric element may be alternately arranged, wherein at least one of the p-type thermoelectric element and the n-type thermoelectric element includes the nano-complex thermoelectric material.

According to an embodiment, there is provided a thermoelectric apparatus including a heat supply source and the thermoelectric module, wherein the thermoelectric module absorbs heat from the heat supply source and includes the nano-complex thermoelectric material, a first electrode, and second electrode, wherein the first and second electrodes face each other. One of the first and second electrodes may contact the nano-complex thermoelectric material.

The thermoelectric apparatus according to an embodiment may further include a power supply source that is electrically connected to the first and second electrodes. A thermoelectric element according to an embodiment may further include an electric device that is electrically connected to one of the first and second electrodes.

The nano-complex thermoelectric material, the thermoelectric element, the thermoelectric module, and the thermoelectric apparatus may be used in a thermoelectric cooling system or a thermoelectric power generating system. Examples of the thermoelectric cooling system include a micro cooling system, a general-purpose cooling device, an air conditioner, and a cogeneration system, but are not limited thereto. A structure and manufacturing method of the thermoelectric cooling system is well known to one of ordinary skill in the art and can be determined without undue experimentation, and thus, further description thereof is omitted.

The disclosed embodiments will be described in greater detail with reference to the following examples. However, the following examples are for illustrative purposes only and are not intended to limit the scope of the invention.

EXAMPLES

Example 1

Preparation of a $Bi_{0.5}Sb_{1.5}Te_3$ Powder

A Bi—Te alloy was prepared as a thermoelectric semiconductor matrix (a starting material). In order to prepare the Bi—Te alloy, Bi, Sb, and Te, which are raw materials, were weighed at a molar ratio of 0.5:1.5:3, put in a quartz tube, sealed in a vacuum under $10^{-4}$ torr, melted at a temperature of 650° C. or higher, and rapidly cooled to prepare an alloy ingot having a composition of $Bi_{0.5}Sb_{1.5}Te_3$. The alloy ingot was ground into a powder having a particle size of several millimeters and then ground again using a high-energy milling method. The $Bi_{0.5}Sb_{1.5}Te_3$ powder was sorted into a powder having a size less than or equal to several tens of micrometers using a mechanical sieve (325 mesh) to obtain an initial powder. The p-type alloy powder having the composition $Bi_{0.5}Sb_{1.5}Te_3$ was used as a thermoelectric matrix.

Preparation of a $Bi_{0.5}Sb_{1.5}Te_3$ Nano-Complex Thermoelectric Material Powder Incorporated with 0.2 wt % of Si 0.05192 grams (g) of tetraethoxysilane and 20 milliliters (mL) of ethyl acetate (EtOAc), as a solvent, were added to 40 mL of a reactor. Then, the reactor was ultrasonically treated with a 40 kHz ultrasonic wave for 30 minutes to obtain a colloid or a solution. Next, 3.5 g of the $Bi_{0.5}Sb_{1.5}Te_3$ powder prepared above was added to the colloid or solution, and the resulting mixture was ultrasonically treated under the same conditions for 30 minutes. While flowing nitrogen gas into the reaction container, the resulting mixture was dried at a temperature of 80° C. overnight, and then the resulting mixture was completely dried in a vacuum oven at temperature of 100° C. for about 6 to about 12 hours. The completely dried powder was reduced through heat treatment at a temperature of about 350° C. to about 400° C. for maximum of 6 hours by continuously flowing nitrogen/hydrogen mixed gas (90 volume %/10 volume %) using a tube furnace to remove an organic group. A nano-complex powder, in which Si nanoparticles are dispersed in the Bi—Te alloy powder, was obtained.

Preparation of Nano-Complex Thermoelectric Material

A nano-complex thermoelectric material was prepared by vacuum sintering the nano-complex powder obtained above using a spark plasma sintering method at a temperature of 480° C. under a pressure of 70 megaPascals (MPa) for 3 minutes.

Example 2

A nano-complex thermoelectric material was prepared in the same manner as in Example 1, except that 0.01480 g of terbium (III) acetate hydrate was used instead of 0.05192 g of tetraethoxysaline.

Example 3

A nano-complex thermoelectric material was prepared in the same manner as in Example 1, except that 0.01488 g of gadolinium (III) acetate hydrate was used instead of tetraethoxysaline.

Example 4

A nano-complex thermoelectric material was prepared in the same manner as in Example 1, except that 0.2959 g of cobalt acetate tetrahydrate was used instead of tetraethoxysilane.

Example 5

A nano-complex thermoelectric material was prepared in the same manner as in Example 1, except that 0.01964 g of zinc acetate was used instead of tetraethoxysilane.

Example 6

A nano-complex thermoelectric material was prepared in the same manner as in Example 1, except that 0.02205 g of manganese (II) acetate was used instead of tetraethoxysilane.

Example 7

A nano-complex thermoelectric material was prepared in the same manner as in Example 1, except that 0.01477 g of palladium (II) acetate was used instead of tetraethoxysilane.

Example 8

A nano-complex thermoelectric material was prepared in the same manner as in Example 1, except that 0.02968 g of nickel acetate tetrahydrate was used instead of tetraethoxysilane.

Example 9

A nano-complex thermoelectric material was prepared in the same manner as in Example 1, except that 0.02180 g of iron (II) acetate was used instead of tetraethoxysilane.

Example 10

A nano-complex thermoelectric material was prepared in the same manner as in Example 1, except that 0.01561 g of molybdenum acetate (dimer) was used instead of tetraethoxysilane.

Comparative Example 1

A thermoelectric material was prepared by sintering the $Bi_{0.5}Sb_{1.5}Te_3$ powder prepared in Example 1 using a spark plasma sintering method under vacuum of 70 MPa at a temperature of 480° C. for 3 minutes.

Figure 6:
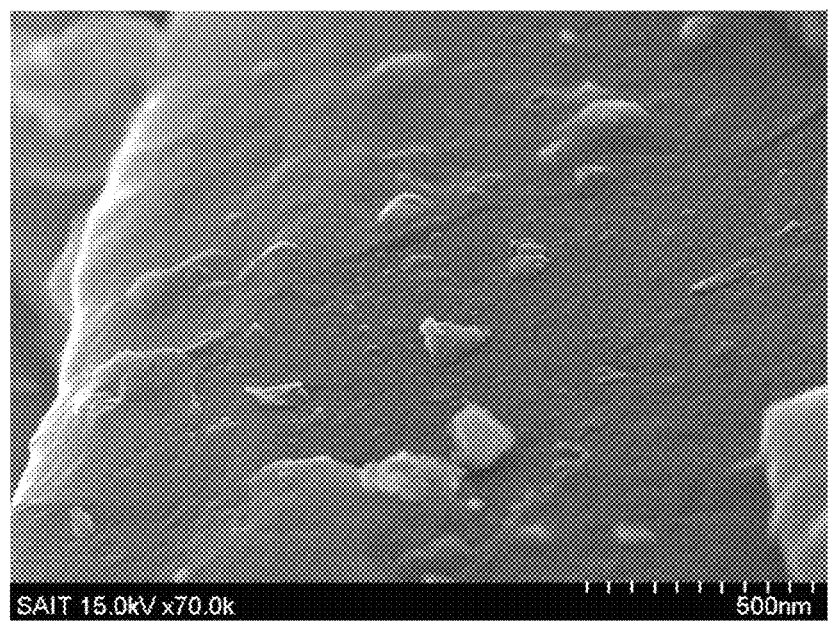
FIG. 6 is a scanning electron microscope (SEM) image of the nano-complex thermoelectric material obtained in Example 1.

FIG. 6 is a scanning electron microscope (SEM) image of the nano-complex thermoelectric material obtained in Example 1. As shown in FIG. 6, the Si nanoparticles are uniformly dispersed in the Bi—Te alloy thermoelectric matrix.

FIGS. 7 through 12 are graphs each showing evaluated results of electrical conductivities, the Seebeck coefficients, power factors, thermal conductivities, lattice thermal conductivities, and thermoelectric performance of the thermoelectric elements manufactured with the nano-complex thermoelectric materials prepared in Examples 1 through 10 and Comparative Example 1. The electrical conductivities were measured by a conventional direct current (DC) 4-probe method at about 320 K to about 520 K. The Seebeck coefficients were measured by a steady-state method. The power factors, $S^2\sigma$ in Equation 1, were calculated by multiplying the electrical conductivities with the squared Seebeck coefficients. The thermal conductivities were calculated using heat capacities measured by a thermal relaxation method, thermal diffusivities measured by a laser-flash method in a vacuum, and bulk densities of the thermoelectric elements. The lattice thermal conductivities may be obtained by subtracting thermal conductivity contribution parts of electrons, which were calculated by using the measured electrical conductivities and the Seebeck coefficients in the Wiedemann-Fraz Law, from a total thermal conductivity.

Figure 7:
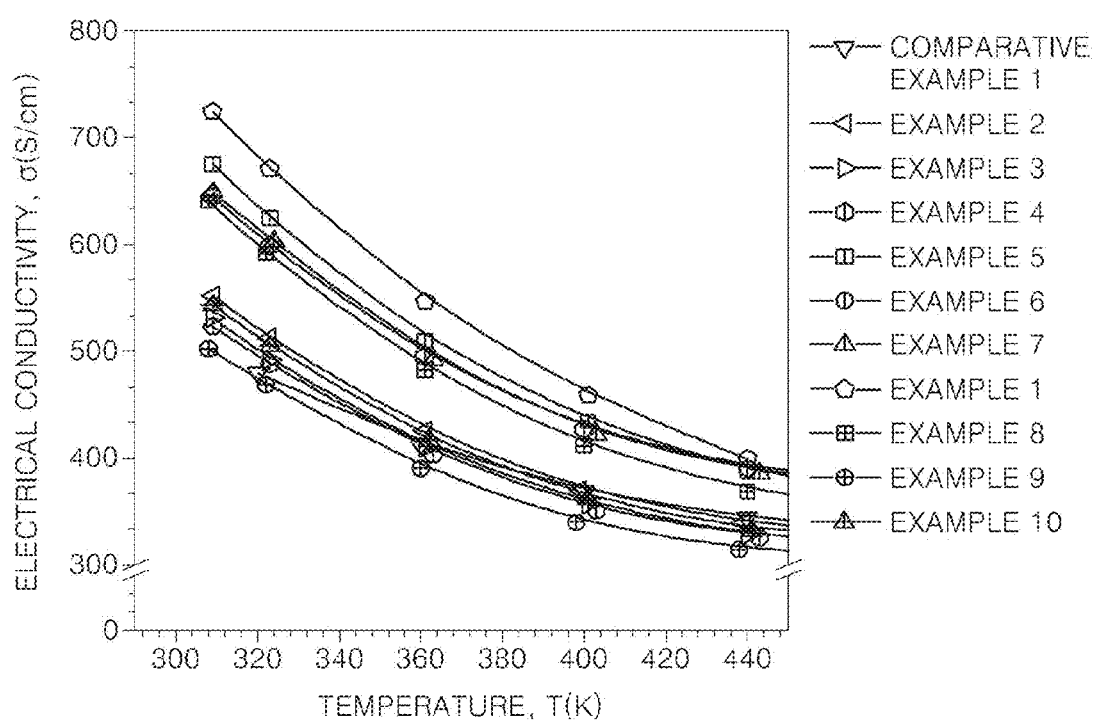
FIG. 7 is a graph of electrical conductivity (Siemens per centimeter, S/cm) versus temperature (Kelvin, K) showing electrical conductivities of the thermoelectric elements obtained in Examples 1 through 10 and Comparative Example 1.
Figure 8:
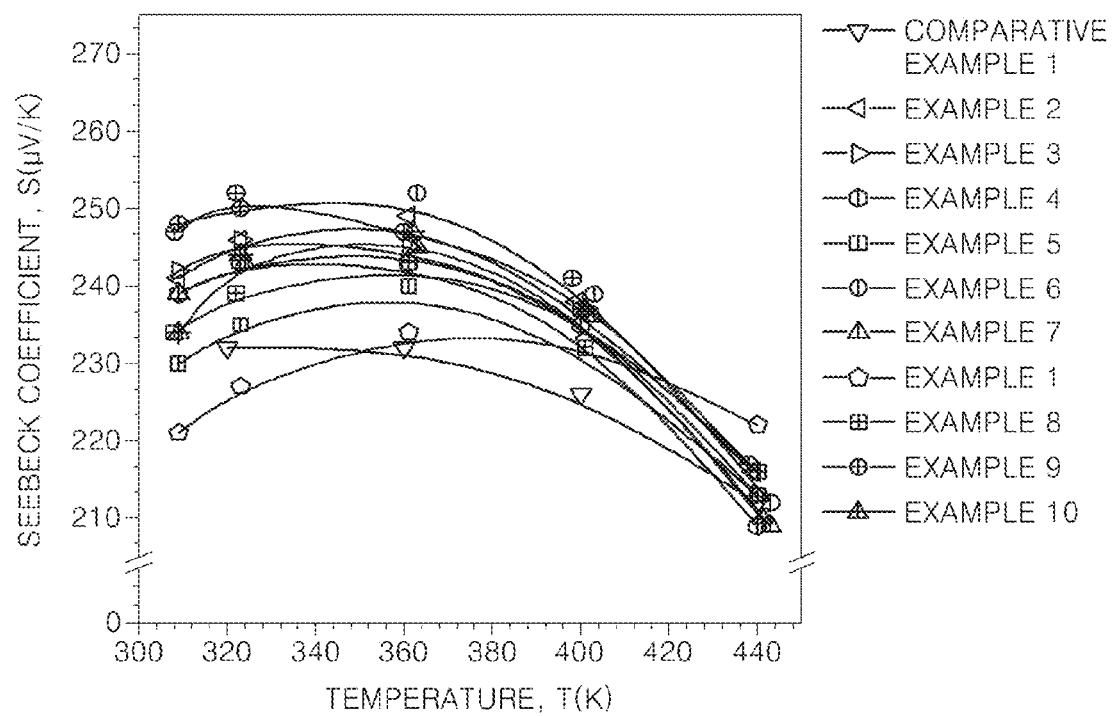
FIG. 8 is a graph of Seebeck coefficient (microvolts per Kelvin, μV/K) versus temperature (Kelvin, K) showing the Seebeck coefficients of the thermoelectric elements obtained in Examples 1 through 10 and Comparative Example 1.
Figure 9:
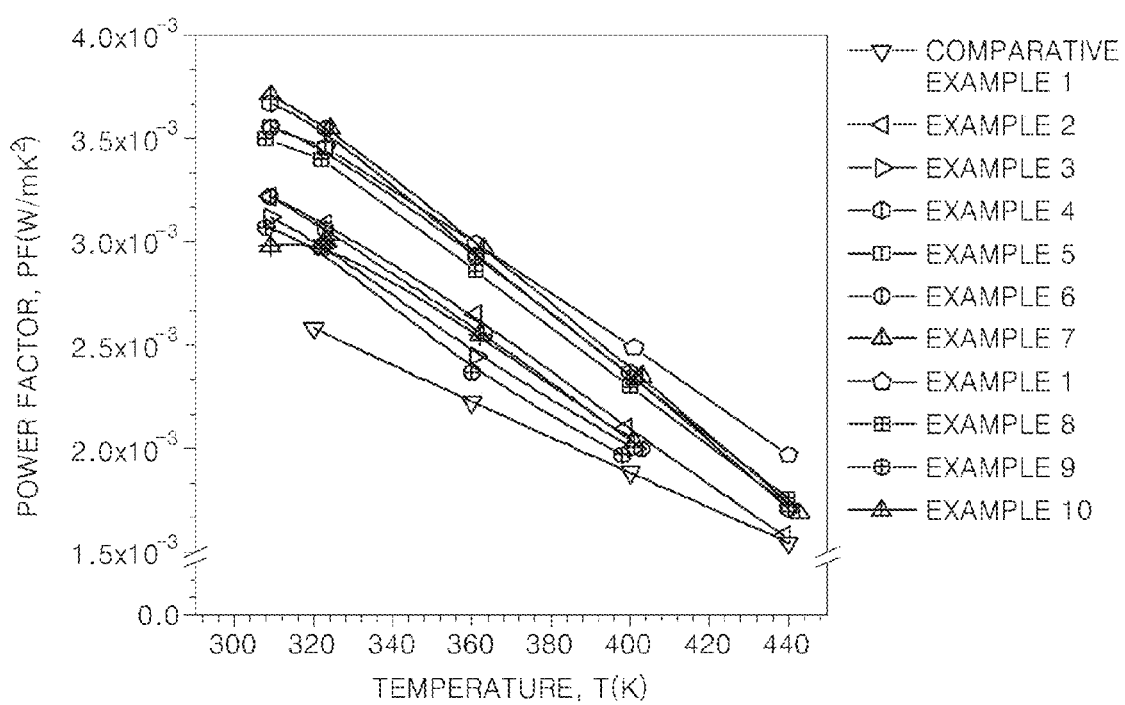
FIG. 9 is a graph of power factor (watts per meter-square Kelvin, W/mK$^2$) versus temperature (Kelvin, K) showing power factors of the thermoelectric elements obtained in Examples 1 through 10 and Comparative Example 1.
Figure 10:
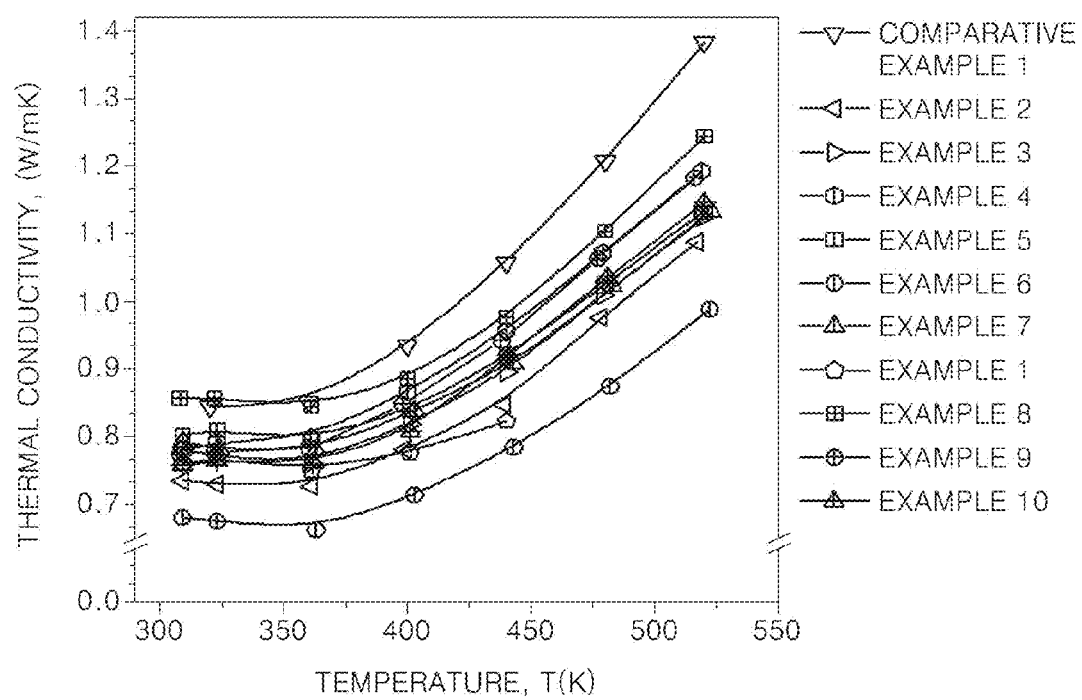
FIG. 10 is a graph of thermal conductivity (Watts per meter-Kelvin, W/mK) versus temperature (Kelvin, K) showing thermal conductivities of the thermoelectric elements obtained in Examples 1 through 10 and Comparative Example 1.
Figure 11:
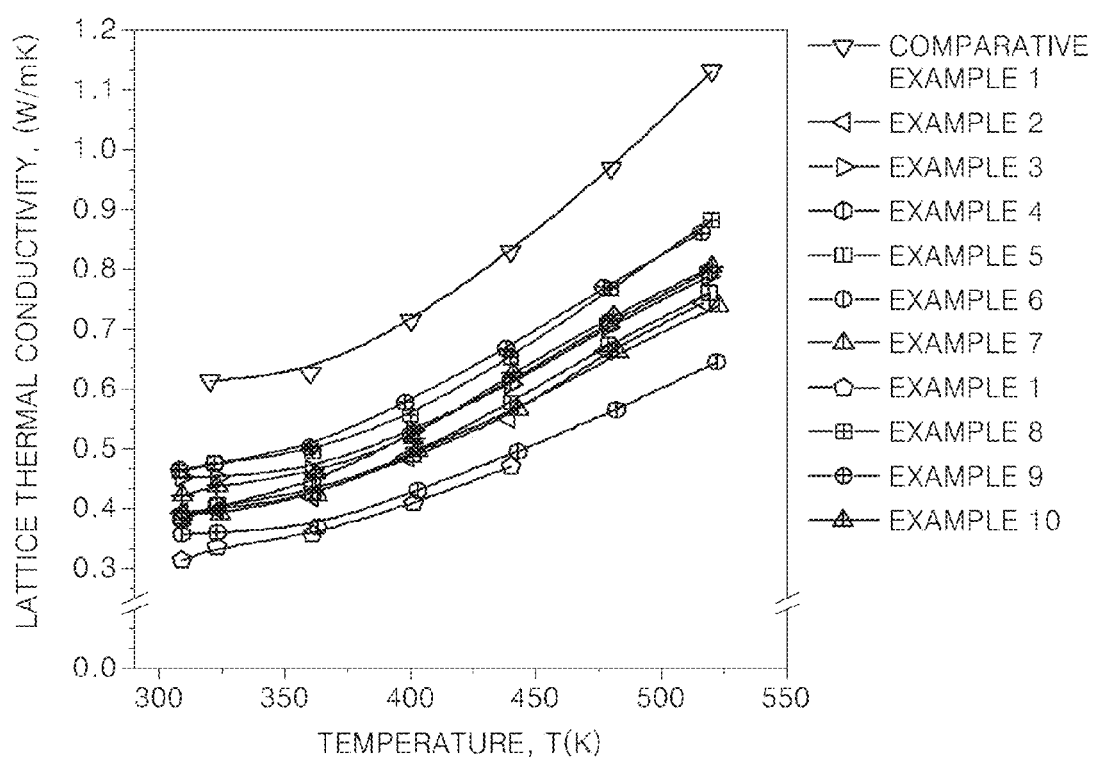
FIG. 11 is a graph of lattice thermal conductivity (Watts per meter-Kelvin, W/mK) versus temperature (Kelvin, K) showing lattice thermal conductivities of the thermoelectric elements obtained in Examples 1 through 10 and Comparative Example 1.
Figure 12:
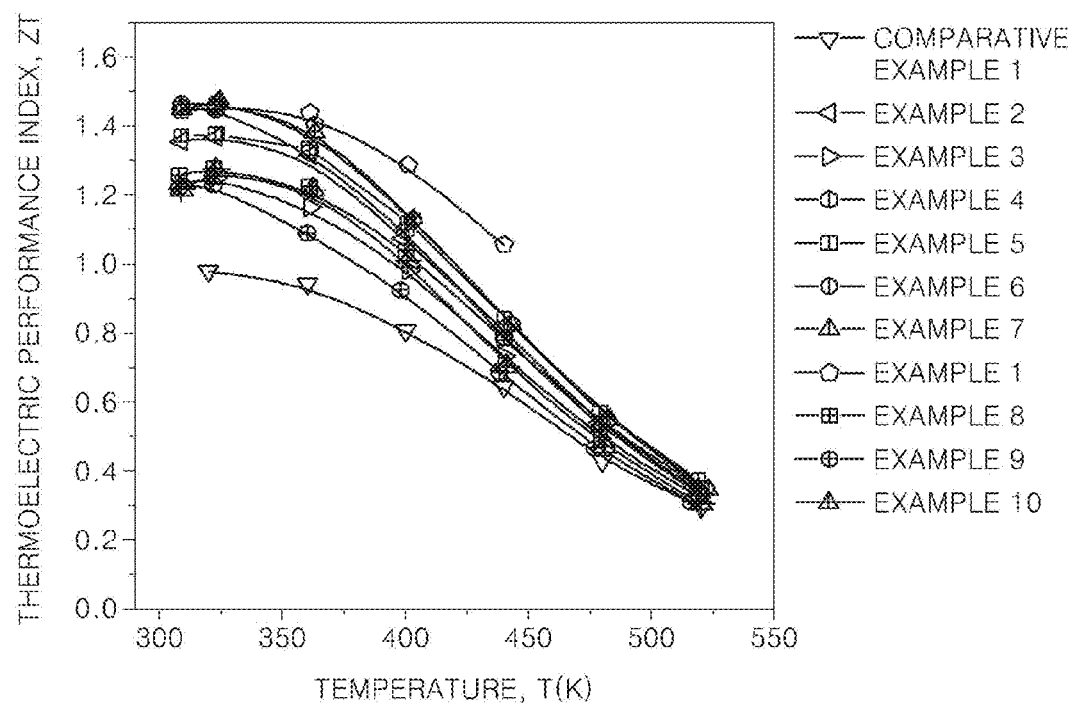
FIG. 12 is a graph of thermoelectric performance index ZT versus temperature (Kelvin, K) showing thermoelectric performance indices (ZTs) of the thermoelectric elements obtained in Examples 1 through 10 and Comparative Example 1.

As shown in FIG. 7, the electrical conductivities of the nano-complex thermoelectric materials of Examples 1 to 10 showed higher values compared to the nano-complex thermoelectric material of Comparative Example 1. The electrical conductivities of the nano-complex thermoelectric materials of Examples 1 to 10 showed similar or lower values compared to that of Comparative Example 1. However, the Seebeck coefficients of the nano-complex thermoelectric materials of Examples 1 to 10 were higher than the nano-complex thermoelectric material of Comparative Example 1 (FIG. 8), and thus, the power factors of the nano-complex thermoelectric materials of Examples 1 to 10 were higher than the nano-complex thermoelectric material of Comparative Example 1 as a result. The thermal conductivities (FIG. 10) and the lattice thermal conductivities (FIG. 11) of the nano-complex thermoelectric materials of Examples 1 to 10 were lower than the nano-complex thermoelectric material of Comparative Example 1, and thus, ZT values (representing the thermoelectric performance of the thermoelectric elements) were significantly higher in Examples 1 to 10 compared to that of Comparative Example 1 (FIG. 12).

As described above, a nano-complex thermoelectric material according to the above embodiment has a remarkable thermoelectric performance as the Seebeck coefficient and electrical conductivity are high and thermal conductivity is very low. A thermoelectric module and a thermoelectric apparatus including the nano-complex thermoelectric material may be effectively used in general cooling systems such as non-refrigerant refrigerators or air conditioners, for electrical generation from waste heat, or thermoelectric nuclear energy generation for military, aerospace, or micro cooling systems.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A thermoelectric material comprising:
   a thermoelectric matrix; and
   a plurality of metal nanoparticles disposed in the thermoelectric matrix,
   wherein a difference between a work function of the thermoelectric matrix and a work function of a metal particle of the metal nanoparticles is about −1.0 electron volt to about 1.0 electron volt,
   wherein the metal nanoparticles comprise one or more selected from Si, Zn, Pd, Co, Ni, Tb, Mo, Gd, Mn, and Fe, and
   wherein the metal nanoparticles are disposed on one or more selected from a surface of grain boundaries and at an interface of grain boundaries of the thermoelectric matrix.

2. The thermoelectric material of claim 1, wherein a difference between the work function of the thermoelectric matrix and the work function of the metal nanoparticle is about −0.41 electron volt to about 0.41 electron volt.

3. The thermoelectric material of claim 1, wherein a difference between the work function of the thermoelectric matrix and an average work function of the plurality of metal nanoparticles is about −1.0 electron volt to about 1.0 electron volt.

4. The thermoelectric material of claim 1, wherein the thermoelectric matrix is represented by Formula 1:

$$A_xM_y,\qquad\text{Formula 1}$$

wherein
A is one or more selected from Bi, Sb, Co, Pb, Mg, and Si,
M is one or more selected from Te, Se, Sb, Si, and Ge,
0<x≤4, and 0<y≤4.

5. The thermoelectric material of claim 1, wherein a work function of the metal nanoparticles is about 3.5 electron volts to about 5.5 electron volts.

6. The thermoelectric material of claim 1, wherein an amount of the metal nanoparticles is about 0.05 part to about 1.0 part by weight, based on a total weight of the thermoelectric matrix.

7. The thermoelectric material of claim 6, wherein an amount of the metal nanoparticles is about 0.1 part to about 0.2 part by weight, based on a total weight of the thermoelectric matrix.

8. The thermoelectric material of claim 1, wherein an average diameter of the metal nanoparticles is about 1 nanometer to about 50 nanometer.

9. The thermoelectric material of claim 1, wherein the thermoelectric matrix is a Bi—Te alloy.

10. The thermoelectric material of claim 9, wherein the Bi—Te alloy is represented by Formula 2:

$$A'_2 M'_3,\qquad\text{Formula 2}$$

wherein A' is one or more selected from Bi and Sb, and M' is one or more selected from Te and Se.

11. The thermoelectric material of claim 1, wherein
the metal nanoparticles comprise one or more selected from Si, Pd, Mn, and Co, and
the thermoelectric matrix is $Bi_x Sb_{2-x} Te_3$ wherein $0.4 \leq x \leq 0.5$.

12. The thermoelectric material of claim 1, wherein the thermoelectric matrix and the metal nanoparticles form a complex.

13. The thermoelectric material of claim 1, wherein the thermoelectric matrix and the metal nanoparticles form a composite.

14. A thermoelectric element comprising the thermoelectric material of claim 1.

15. The thermoelectric element of claim 14, wherein the metallic nanoparticles form a concentration gradient between a first end and an opposite second end of the thermoelectric element.

16. A thermoelectric module comprising:
a first electrode;
a second electrode; and
the thermoelectric element of claim 14 disposed between the first and second electrodes.

17. A thermoelectric apparatus comprising:
a heat supply source; and
the thermoelectric module of claim 16, which is effective to absorb heat from the heat supply source.

18. A manufacturing method of the thermoelectric material of claim 1, the manufacturing method comprising:
providing a precursor of metal nanoparticles in an organic solvent;
adding a thermoelectric matrix powder to the precursor of metal nanoparticles in an organic solvent to form a mixture; and
drying and heat treating the mixture to manufacture the thermoelectric material.

19. The manufacturing method of claim 18, wherein the precursor of the metal nanoparticles comprises one or more selected from an acetate, an acetylacetonate, or an alkoxide of a metal.

20. The manufacturing method of claim 18, further comprising bulking the thermoelectric material by press sintering after the drying and the heat treating.

21. The manufacturing method of claim 18, wherein the contacting of the thermoelectric matrix powder and the precursor further comprises ultrasonic treating.

22. The manufacturing method of claim 18, wherein the precursor is a colloid.

* * * * *